United States Patent [19]

Hayama et al.

[11] Patent Number: 4,754,152

[45] Date of Patent: Jun. 28, 1988

[54] OPTICAL READER AND METHOD FOR ITS MANUFACTURE

[75] Inventors: Masahiro Hayama; Hidejiro Miki, both of Amagasaki, Japan

[73] Assignee: Mitsubishi Denki Kabushiki Kaisha, Tokyo, Japan

[21] Appl. No.: 866,304

[22] Filed: May 23, 1986

[30] Foreign Application Priority Data

Jun. 24, 1985 [JP] Japan ................................ 60-139620

[51] Int. Cl.$^4$ ............................................. H01J 40/14
[52] U.S. Cl. ..................................... 250/578; 313/366; 357/2; 357/22; 357/24; 358/44; 358/212; 358/213.11; 358/293; 358/294; 428/209; 428/192; 428/457; 428/688
[58] Field of Search ........................ 250/578; 313/366; 358/44, 212, 213, 293, 294; 357/22 B, 2, 24; 428/209; 528/374

[56] References Cited

U.S. PATENT DOCUMENTS

| | | | |
|---|---|---|---|
| 4,031,313 | 6/1977 | Franz et al. | 428/209 |
| 4,176,369 | 11/1979 | Nelson et al. | 250/211 J |
| 4,194,174 | 3/1980 | DeLise | 427/101 |
| 4,370,797 | 2/1983 | van Gorkom et al. | 313/366 |
| 4,390,586 | 6/1983 | Lemelson | 428/209 |
| 4,419,696 | 12/1983 | Hamano et al. | 250/578 |
| 4,430,666 | 2/1984 | Nakatsui et al. | 358/44 |
| 4,518,646 | 5/1985 | Nichols, Jr. | 428/209 |
| 4,527,007 | 7/1985 | Fuse | 427/74 |
| 4,549,088 | 10/1985 | Ozawa | 250/578 |
| 4,567,374 | 1/1986 | Takenouchi et al. | 250/578 |
| 4,570,076 | 2/1986 | Hamano et al. | 250/578 |

OTHER PUBLICATIONS

Design and Evaluation of A4 Amorphous Si Hybrid Image Sensor published in May, 1982. (pp. 132-137), T. Ozawa et al.

*Primary Examiner*—George F. Lesmes
*Assistant Examiner*—James B. Monroe
*Attorney, Agent, or Firm*—Oblon, Fisher, Spivak, McClelland & Maier

[57] ABSTRACT

An optical reading device with the least cross-talk and good reading resolution, which is constructed with a plurality of metal electrodes disposed on an insulating base plate in a spaced apart relationship for each bit, a photoconductive film provided on the plurality of metal electrodes, and a transparent electrically conductive film disposed in confrontation to the plurality of metal electrodes, wherein the photoconductive film possesses high resistance value at least at the side thereof facing the metal electrode, the transparent electrically conductive film and the photoconductive film are cut out at their portions corresponding to a positional space between adjacent metal electrodes, and the photoconductive film does not substantially protrude from the transparent electrically conductive film at a portion where the transparent electrically conductive film confronts to each of the metal electrodes.

6 Claims, 3 Drawing Sheets

Prior Art

OPTICAL READER AND METHOD FOR ITS MANUFACTURE

BACKGROUND OF THE INVENTION

1. Field of the Invention

This invention relates to a thin-film-sandwich type optical reading device having an electrode of a transparent electrically conductive film on one surface of a photoconductive film and a metal electrode on the other surface of it, the optical reading device being used as, for example, a photo-sensor array in a facsimile transmitter, and so forth. The present invention is also concerned with a method for manufacturing such optical reading device.

2. Description of Prior Art

FIGS. 3, 4(a), and 4(b) of the accompanying drawings illustrate a structure of a conventional sandwich type optical reading device, in which FIG. 3 is a plan view of the optical reader, FIG. 4(a) is a cross-sectional view taken along a line IV A—IV A in FIG. 3, and FIG. 4(b) is a partial cross-sectional view taken along a line IV B—IV B in FIG. 3.

The optical reader as illustrated in these figures of drawings is constructed with a plurality of metal electrodes 2 disposed on one surface of an insulating base plate 1 in a spaced apart relationship for each bit, a photoconductive film 3 in a rectangular shape made of amorphous silicon, and a transparent electrically conductive film 4 also in a rectangular shape.

While the above-mentioned photoconductive film 3 continuously covers the metal electrodes 2 without being spaced apart for each bit, hence it can be easily manufactured, it has a disadvantage such that there would unavoidably take place cross-talk among the bits, even if it is formed of a highly resistive, undoped amorphous silicon, with the consequence that no reading can be done with high resolving power. It has also such a point of problem that a region where the photo-current occurs is not limited only to an overlapped portion of the metal electrode 2 and the transparent electrically conductive film 4, but it is dependent on the area of the photoconductive film 3 with the consequent expansion of its sensitivity region.

As one way of solving such points of problem with the conventional optical reader having the rectangular photoconductive film, there has been a practice of dividing the photoconductive film into each bit, which takes an example after the solar battery. One example of such structure is shown in FIGS. 5(a) and 5(b) of the accompanying drawings, in which FIG. 5(a) is a cross-sectional view taken along a line VA—VA in FIG. 5(b) and FIG. 5(b) is a cross-sectional view taken along a line V—V in FIG. 5(a).

As illustrated, this type of the optical reader is so constructed that a plurality of metal electrodes 2 which are spaced apart for each bit are disposed on one surface of the insulating base plate 1, and each of n-, i-, and p-type amorphous silicon films is formed as the photoconductive film 3 on each of the metal electrodes 2 in the sequence of n-i-p with perfect isolation among the bits. In addition, with a view to reducing leak current from the end face between the transparent electrically conductive film 4 and the photoconductive film 3 on the metal electrode 3, the end face of the photoconductive film 3 is covered with an insulating film 5, after which the transparent electrically conductive film 4 is formed over these metal electrodes, the photoconductive film, and the insulating film.

While this type of optical reader, wherein the photoconductive film 3 is perfectly spaced apart among the bits, is free from the undesirable cross-talk among the bits, hence reading can be done with high resolving power, it still has shortcomings such that the region where the photo-current occurs is not limited only to the overlapped portion of the metal electrode 2 and the transparent electrically conductive film 4, but it is dependent on the area of the photoconductive film 3, and further that the number of working steps increases to make its manufacture complicated and troublesome.

As described in the foregoing, the conventional optical reading device having the rectangular photoconductive film suffers from its disadvantages such that the cross-talk among the bits is unavoidable, and the photo-current is dependent on the area of the photoconductive film with the consequence that its photosensitive region tends to expand. Moreover, the optical reading device having the photoconductive film perfectly spaced apart among the bits also suffers from its disadvantages such that the photo-current is dependent on the area of the photoconductive film with the result that its photosensitive region tends to expand, and that the number of manufacturing steps increases to make its manufacture complicated and troublesome.

As the result of strenuous studies and researches made by the present inventors on the cause of the above-mentioned points of problem, it has been discovered that, when the photoconductive film is not perfectly spaced apart for each bit, the cross-talk would take place as soon as the adjacent bits become closer to a distance of from 50 to 100 $\mu$m or so. Further, change in the photo-current by the area of the photoconductive film is found to occur in the following situations: that is to say, in case the transparent electrically conductive film is made an electrode common to every bit and is grounded, (1) a portion where the metal electrode and the photoconductive film overlap each other without presence of the transparent electrically conductive film has the photosensitivity; on the contrary, (2) a portion where the photoconductive film and the transparent electrically conductive film overlap each other without presence of the metal electrode has the photosensitivity which is substantially negligible.

SUMMARY OF THE INVENTION

The present invention has been made with a view to solving the points of problem as described in the foregoing on the basis of the results of studies and researches as mentioned above, and aims at providing an optical reader of an improved quality and performance such that it is easy to be manufactured, is capable of preventing undersirable cross-talk among the bits and dependence of the photosensitivity on the area of the photoconductive film, and has high resolving power for reading without expansion of the photosensitive region.

It is also another object of the present invention to provide a method for manufacturing such optical reader.

According to the present invention, in one aspect of it, there is provided an optical reader constructed with a plurality of metal electrodes disposed on an insulating base plate in a spaced apart relationship for each bit, a photoconductive film provided on said plurality of metal electrodes, and a transparent electrically conductive film disposed on said photoconductive film in confrontation to said plurality of metal electrodes, said optical reader being characterized in that said photoconductive film has high resistance at least at the side thereof facing said metal electrode, that said transparent electrically conductive film and said photoconductive film are cut out at a their portions corresponding to a positional space between adjacent metal electrodes, and that said photoconductive film does not substantially protrude from said transparent electrically conductive film at a portion where said transparent electrically conductive film confronts to said each metal electrode.

According to the present invention, in another aspect of it, there is provided a method for manufacturing an optical reader, which comprises the steps of: forming a plurality of metal electrodes on an insulating base plate in a spaced apart relationship for each bit; forming a photoconductive film having high resistance at least at the side thereof facing said metal electrode on said plurality of metal electrodes; forming a transparent electrically conductive film on said photoconductive film in confrontation to said each metal electrode and in the form of its being cut out at a portion corresponding to a positional space between said adjacent metal electrodes; and subjecting said photoconductive film to etching with said transparent electrically conductive film being made a mask to render said photoconductive film to be substantially discontinuous between said adjacent metal electrodes.

The foregoing objects, other objects as well as specific construction of the optical reader according to the present invention, and the method of manufacturing the same will become more apparent and understandable from the following detailed description thereof, when read in conjunction with the accompanying drawing and practical examples of manufacturing the same.

BRIEF DESCRIPTION OF THE ACCOMPANYING DRAWINGS

Figure 5A:
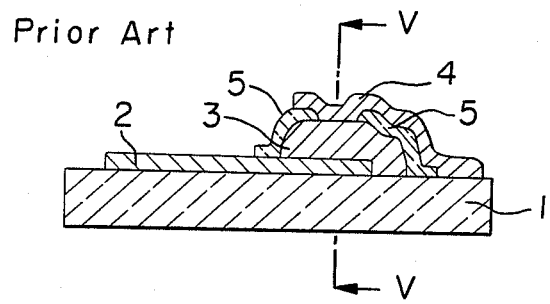
Figure 5B:
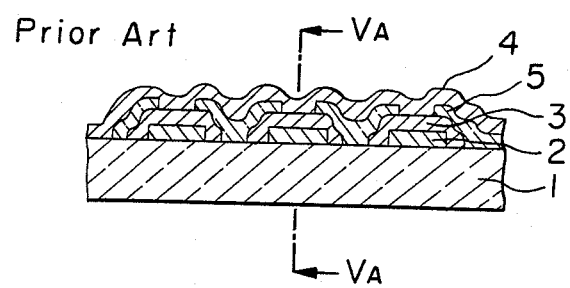

FIGS. 5(a) and 5(b) are respectively cross-sectional views of another type of the conventional optical reader.

DETAILED DESCRIPTION OF THE PREFERRED EMBODIMENT

In the following, the present invention will be explained in more detail in reference to the accompanying drawings.

Figure 1:
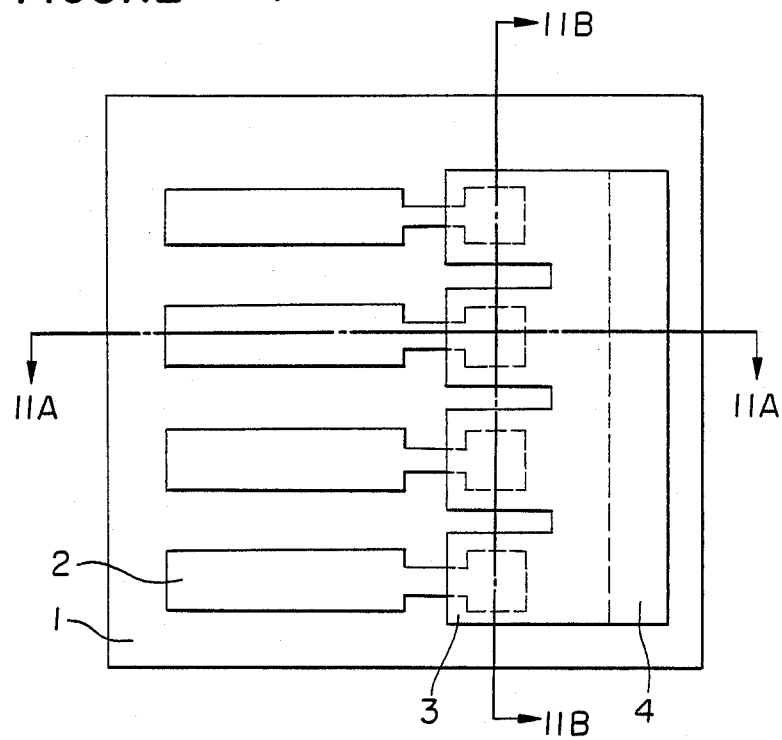
FIG. 1 is a plan view showing a preferred embodiment of the optical reading device according to the present invention.
Figure 2A:
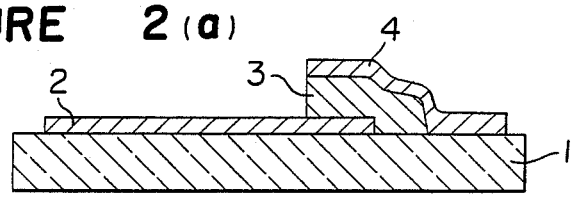
FIG. 2(a) is a cross-sectional view of the optical reader shown in FIG. 1, taken along a line II A—II A therein.
Figure 2B:
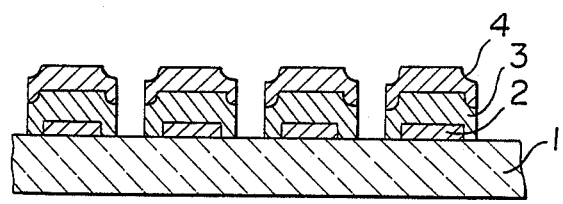
FIG. 2(b) is also a cross-sectional view taken along a line II B—II B in FIG. 1.
Figure 3:
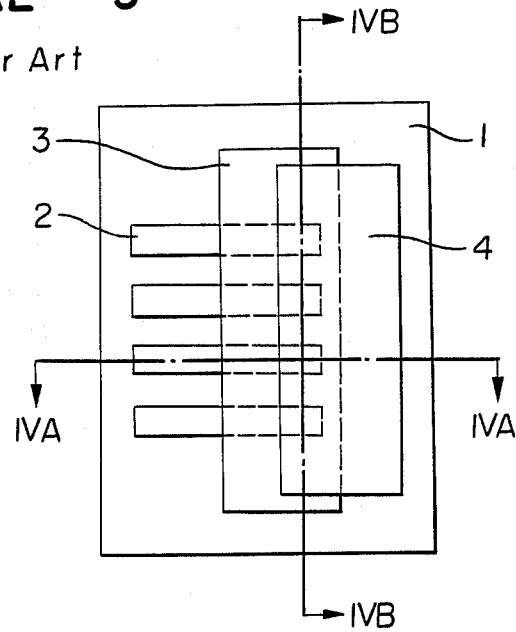
FIG. 3 is a plan view of the conventional optical reading device.
Figure 4:
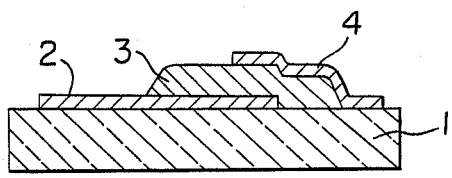
FIG. 4(a) is a cross-sectional view of the conventional optical reader shown in FIG. 3, taken along a line IV A—IV A therein.
FIG. 4(b) is a cross-sectional view taken along a line IV B—IV B in FIG. 3.
Figure 4:
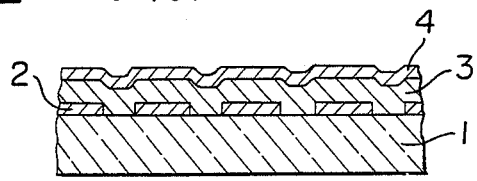

FIG. 1 is a plan view showing one preferred embodiment of the optical reading device according to the present invention; FIG. 2(a) is a cross-sectional view taken along a line II A—II A in FIG. 1; and FIG. 2(b) is also a cross-sectional view taken along a line II B—II B in FIG. 1.

In the drawings, a reference numeral 1 designates an insulating base plate; a numeral 2 refers to a plurality of metal electrodes formed in a predetermined pattern on the insulating base plate 1 in a spaced apart relationship for each bit; a reference numeral 3 denotes a photoconductive film formed in a comb-shaped pattern on the metal electrodes 2 by cutting out its portion corresponding to the positional space between the adjacent metal electrodes 2 with a breadth of 200 $\mu$m or more, the photoconductive film having a high resistance at least at its side facing the metal electrode 2, the resistance value of which should preferably be $10^3$ $\Omega$cm or higher; and a numeral 4 refers to a transparent electrically conductive film formed on the photoconductive film 3 in the same comb-shaped pattern as that of the photoconductive film by cutting its portions corresponding to the positional space between the adjacent metal electrodes 2. Incidentally, the photoconductive film 3 does not protrude from the transparent electrically conductive film 4 at its portion where the transparent electrically conductive film 4 confronts to the metal electrode 2.

The insulating base plate 1 may be made of glass, alumina, plastic, and so forth.

The metal electrode 2 may be made of Cr, Cr-Al (double layers), Cr-Au (double layers), Ni, Al, Pt, Pd, Mo, Ti, and so on.

The photoconductive film 3 may be made of, for example, an undoped i-type amorphous hydrogenated silicon, or, for higher resistance to be given, p-type amorphous hydrogenated silicon doped with a very small amount of boron, and others. The thickness of this amorphous silicon film may appropriately be in the range of from 0.3 $\mu$m to 5 $\mu$m. The resistance value of this film should desirably to $10^8$ $\Omega$cm or higher.

This amorphous silicon film may be formed by the plasma CVD method, sputtering method, vapor-deposition method, photo-CVD method, and so forth, by which a uniform film can be formed. By the way, as the photoconductive film 3, there may be adopted a double-layer structure, in which amorphous silicon highly doped with boron, or silicon carbide is laminated to a thickness of from a few to 1,000 Å over a mono-layer of the above-mentioned i-type amorphous hydrogenated silicon or p-type amorphous hydrogenated silicon having a thickness of from 0.3 $\mu$m to 5 $\mu$m. In this instance, the highly doped amorphous silicon layer should desirably have its resistance value of $10^5$ $\Omega$cm or lower.

The transparent electrically conductive film 4 may be made of, for example, ITO ($In_2O_3 + SnO_2$), $SnO_2$, and so forth, the film thickness of which may appropriately be in the range of from 300 Å to 5,000 Å, or so. The transparent electrically conductive film 4 is formed in a desired pattern by use of the photographic technique. Thus, the transparent electrically conductive film 4 for the purpose of the present invention has the comb-shaped pattern by cutting out, or removing, its portions corresponding to the positional space between the adjacent metal electrodes 2, as already mentioned in the foregoing. Then, the transparent electrically conductive film 4 which has been processed into such desired pattern is placed over the photoconductive film 3 as a masking to subject the latter to the etching process. The amorphous silicon film constituting the photoconductive film 3 is etched by the dry-etching method by use of $CF_4$ gas or $SF_6$ gas. The portions to be removed from this photoconductive film 3 should be to such an extent that no carrier movement may take place to and from the adjacent bits through this photoconductive film 3 between the adjacent metal electrodes, to wit, no crosstalk may take place. In practice, the width of the cut-out portions in the photoconductive film 3 between the adjacent metal electrodes 2 should appropriately be made 200 μm or greater, because the cross-talk occurs when the adjacent bits come closer each other to a distance of from 50 μm to 100 μm or so.

Incidentally, when the photoconductive film 3 is removed by use of the transparent electrically conductive film 4 as the mask after it has been patterned, the removal of the photoconductive film 3 may be done either in full depth or in part, since it is sufficient to form a groove of such an extent that does not bring about movement of the carrier between the adjacent metal electrodes 2, i.e., between the adjacent bits.

Thus, according to the present invention, since the photoconductive film 3 is formed in such a manner that it may not substantially protrude from the transparent electrically conductive film 4 at a portion where it confronts to the metal electrode 2, dependence of the photosensitivity on the area of the photoconductive film can be prevented; further, since the corresponding portions of the photoconductive film to the adjacent metal electrodes are effectively cut out or removed, the optical reading device is free from undesirable cross-talk, hence it possesses high resolving power in its reading operation and moveover it can be manufactured easily.

With a view to enabling those persons skilled in the art to put this invention into practice, the following preferred examples of manufacturing the optical reader will be described.

EXAMPLE 1

On the insulating base plate 1 made of glass, there was formed a layer of chromium (Cr) as the metal electrode 2 to a film thickness of 2,000 Å by the electron beam deposition, which was then patterned in a predetermined shape by the photolithographic technique in a spaced apart relationship for each bit. The pitch of the reading elements was 8 lines/mm. Subsequently, undoped amorphous silicon was formed to a thickness of 2 μm by means of the plasma CVD method using $SiH_4$ gas to produce the photoconductive film 3, over which p-type amorphous silicon was formed by means of the plasma CVD method using a mixture gas of $B_2H_6$ and $SiH_4$ to a film thickness of 100 Å. Further, an ITO film was formed on this photoconductive film 3 to a film thickness of about 2,000 Å to thereby obtain the transparent electrically conductive film 4. This ITO film was then patterned into the comb-shape, as shown in FIG. 1, by use of the photolithographic technique. Thereafter, with this patterned ITO film as the mask, the amorphous silicon was dry-etched in the above-mentioned comb-shaped pattern by use of $CF_4$ gas.

The thus obtained optical reading device showed the ratio of cross-talk of 0.1% or less between the adjacent bits. The photo-current occured was the same as that when its light-receiving sensor part of 100 μm×100 μm was irradiated with light.

EXAMPLE 2

The same process steps as in Example 1 above were followed with the exception that an undoped i-type amorphous silicon film was formed to a thickness of 2 μm as the photoconductive film 3, thereby obtaining the optical reading device having the same comb-shaped pattern. The device showed that it had the same characteristics as those obtained in Example 1 above.

COMPARATIVE EXAMPLE 1

On the insulating base plate 1 made of glass, there was formed a layer of chromium (Cr) as the metal elecrtrode 2 to a film thickness of about 2,000 Å by the electron beam deposition, which was then patterned in a predetermined shape by the photolithographic technique. The pitch of the reading elements was 8 lines/mm. Subsequently, i-type amorphous silicon was formed in a rectangular shape having a thickness of 2 μm to thereby obtain the photoconductive film 3. The width of the rectangular photoconductive film was made approximately 2 mm at both ends of the light receiving element for a length of 1 mm each. Thereafter, on this photoconductive film there was formed the ITO film as the transparent electrically conductive film 4 in a rectangular shape.

The thus manufactured optical reading device showed a cross-talking ratio of from 3 to 5% between the adjacent bits. The photo-current occured was approximately twice as large as that occurrred when the light receiving sensor part of 100 μm×100 μm was irradiated with light.

As has been explained in the foregoing, the present invention provides an optical reading device which is constructed with a plurality of metal electrodes disposed on an insulating base plate in a spaced apart relationship for each bit, a photoconductive film provided on the plurality of metal electrodes, and a transparent electrically conductive film disposed on the photoconductive film in confrontation to the plurality of metal electrodes, wherein the photoconductive film possesses high resistance value at least at the side thereof facing the metal electrode, the tranparent electrically conductive film and the photoconductive film are cut out at their portions corresponding to a positional space between adjacent metal electrodes, and the photconductive film does not substantially protrude from the transparent electrically conductive film at a portion where the transparent electrically conductive film confronts to each of the metal electrodes, in conseqence of which there accrue such remarkable effects that the optical reading device as manufactured has the least cross-talking ratio between the adjacent bits, prevents the photocurrent from occurring at a portion other than the overlapped portion of the metal electrode and the transparent electrically conductive film, hence it has the high resolution in reading without expansion of the photosensitive region.

Moreover, the present invention provides a method for manufacturing an optical reading device comprising the steps of: forming a plurality of metal electrodes on an insulating base plate in a spaced apart relationship for each bit; forming a photoconductive film having high resistance at least at the side thereof facing the metal electrode on the plurality of metal electrodes; forming a transparent electrically conductive film on the photoconductive film in confrontation to each of the metal electrodes and in the form of its being cut out at a portion corresponding to a positional space between the adjacent metal electrodes; and subjecting the photoconductive film to etching with the transparent electrically conductive film being made a mask to render the photoconductive film to be substantially discontinuous between the adjacent metal electrodes, as the consequence of which there accrues such a remarkable effect that the high performance optical reading device as mentioned above can be manufactured easily.

Although the present invention has so far been described in detail with specific reference to a preferred embodiment thereof, it should be understood that the invention is not limited to this specific embodiment alone, but susceptible of various changes and modifications to be made by those skilled persons in the art without departing from the spirit and scope of the invention as set forth in the appended claims.

What is claimed is:

1. An optical reading device constructed with a plurality of metal electrodes disposed on an insulating base plate in a spaced apart relationship for each bit, a photoconductive film including portions provided on said plurality of metal electrodes and portions provided on said base plate, and a transparent electrically conductive film disposed on said photoconductive film in confrontation to said plurality of metal electrodes, said optical reading device being characterized in that said photoconductive film has high resistance at least at the side thereof facing said metal electrode; that said transparent electrically conductive film and said photoconductive film are cut out at their portions corresponding to a positional space between adjacent metal electrodes; that said electrically conductive film commonly contacts the portions of said photoconductive film in contact with the base plate; and that said photoconductive film does not protrude from said transparent electrically conductive film at a portion where said transparent electrically conductive film confronts to said each metal electrode.

2. An optical reading device according to claim 1, wherein said transparent electrically conductive film and said photoconductive film are cut out with a width of 200 μm or more at a positional space between the adjacent metal electrodes.

3. An optical reading device according to claim 1, wherein said photoconductive film is of a single layer, and has high resistance.

4. An optical reading device according to claim 1, wherein said photoconductive film consists of two layers of amorphous silicon defining a p-i junction.

5. A method for manufacturing an optical reading device, which comprises the steps of:
   (a) forming a plurality of metal electrodes on an insulating base plate in a spaced apart relationship for each bit;
   (b) forming a photoconductive film having high resistance at least at the side thereof facing said metal electrode on said plurality of metal electrodes and on said base plate;
   (c) forming a transparent electrically conductive film on said photoconductive film in confrontation to said each metal electrode and on portions of said photoconductive film formed on the base plate and in the form of its being cut out at its portions corresponding to a positional space between said adjacent metal electrodes; and
   (d) subjecting said photoconductive film to etching with said transparent electrically conductive film being made a mask to render said photoconductive film to be substantially discontinuous between said adjacent metal electrodes.

6. A method for manufacturing an optical reading device according to claim 5, wherein the step of forming a photoconductive film consists of the following steps:
   (a) forming an i-type amorphous silicon film; and
   (b) forming a p-type amorphous silicon film.

* * * * *